(12) United States Patent
Yu et al.

(10) Patent No.: US 8,495,443 B1
(45) Date of Patent: Jul. 23, 2013

(54) SECURE REGISTER SCAN BYPASS

(75) Inventors: Jianlin Yu, Cupertino, CA (US);
Santiago Fernandez-Gomez,
Sunnyvale, CA (US); Samy Makar,
Fremont, CA (US)

(73) Assignee: Apple Inc., Cupertino, CA (US)

( * ) Notice: Subject to any disclaimer, the term of this patent is extended or adjusted under 35 U.S.C. 154(b) by 146 days.

(21) Appl. No.: 13/149,134

(22) Filed: May 31, 2011

(51) Int. Cl.
*G01R 31/28* (2006.01)

(52) U.S. Cl.
USPC .......................................... 714/729; 714/730

(58) Field of Classification Search
USPC ................. 714/729–730, 726–728, 733, 739, 714/743, 724, 25, 30, 27, 29, 1; 377/64, 67, 377/69, 70, 76, 81
See application file for complete search history.

(56) References Cited

U.S. PATENT DOCUMENTS

| | | | | |
|---|---|---|---|---|
| 4,894,830 A * | 1/1990 | Kawai | ........................... | 714/731 |
| 6,018,815 A | 1/2000 | Baeg | | |
| 6,314,539 B1 | 11/2001 | Jacobson | | |
| 6,380,724 B1 | 4/2002 | Mahurin | | |
| 6,408,414 B1 | 6/2002 | Hatada | | |
| 6,587,981 B1 | 7/2003 | Muradali | | |
| 6,615,380 B1 | 9/2003 | Kapur | | |
| 6,711,708 B1 | 3/2004 | Shimomura | | |
| 6,745,356 B1 | 6/2004 | Wong | | |
| 6,757,856 B2 | 6/2004 | Bassett | | |
| 6,766,501 B1 | 7/2004 | Duggirala | | |
| 7,010,732 B2 * | 3/2006 | Firth et al. | ..................... | 714/718 |
| 7,062,693 B2 | 6/2006 | Sweet | | |
| 7,069,486 B2 | 6/2006 | Nagamine | | |
| 7,228,440 B1 | 6/2007 | Giles | | |
| 7,539,915 B1 * | 5/2009 | Solt | .............................. | 714/726 |
| 7,725,788 B2 | 5/2010 | Tkacik | | |
| 7,849,310 B2 | 12/2010 | Watt | | |
| 2004/0088659 A1 | 5/2004 | Mori | | |

FOREIGN PATENT DOCUMENTS

| JP | 2002122637 | 4/2002 |
|---|---|---|
| WO | 2007041356 | 4/2007 |

* cited by examiner

*Primary Examiner* — Christine Tu
(74) *Attorney, Agent, or Firm* — Lawrence J. Merkel; Meyertons, Hood, Kivlin, Kowert & Goetzel, P.C.; Erick A. Heter

(57) ABSTRACT

An apparatus and method for protecting the contents of a secure register from scan accessibility is disclosed. The secure register may include a number of scannable elements within a scan chain. During a normal scan test mode, the scannable elements of the secure register may be accessibly, as data may be shifted to, from, or through these elements. During certain other modes (e.g., a scan dump or memory dump), a bypass circuit may be invoked to effectively separate the scan elements associated with the secure register from the remainder of the scan chain. During operation in one of these modes, no data may be shifted to, from, or through the scan elements of the secure register. Accordingly, the bypass path may protect secure data stored in the secure register from unauthorized access.

25 Claims, 6 Drawing Sheets

SECURE REGISTER SCAN BYPASS

BACKGROUND

1. Field of the Invention

This invention relates to scan testing, and more particularly, to the bypassing of secure registers coupled to scan elements.

2. Description of the Related Art

Circuitry to support scan testing may provide internal access to an integrated circuit (IC). Scan circuitry may be implemented by forming chains of scannable elements. Data may be serially shifted through the scannable elements of the scan chain. This may allow for the input of test stimulus data, as well as the capture and shifting out of test result data. Using available scan circuitry, manufacturing tests may be conducted on ICs prior to their shipment to a customer in order to verify the circuitry therein. Scan circuitry may also support hardware debugging during the development phase of an IC, providing information for future revisions thereof.

Since scan chains may provide internal access to an IC, they may have use that extends beyond manufacturing test. One of these uses is support for the debugging of software that is being designed to operate on the IC. Software in a development phase may require extensive debugging in order to remove errors and arrive at a finished product. Some of the errors in the software may be related to the manner in which it interacts with the circuitry of a chip. Accordingly, when an error is encountered during the debugging of software executing on the IC, scan circuitry may be used to capture internal data that can be used to analyze the problem. In some cases, scan circuitry may support a scan dump, which may enable the capture of an internal state of the chip. Scan circuitry may also support a memory dump, which can enable the capture of contents of one or more memories (e.g., register files, random storage memories, caches, etc.) in the IC. Accordingly, scan dumps and memory dumps may provide a useful tool for analysis of software bugs that occur during the development process.

SUMMARY

Various embodiments of a method and apparatus for protecting the contents of a secure register during scan dumps and memory dumps are disclosed. In one embodiment, an integrated circuit includes a scan chain including a number of serially coupled scan elements. A subset of the scan elements are included as part of a secure register, while the remaining scan elements are not included in the secure register. The secure register may be accessible during normal scan testing operations, where data may be shifted through and written into the register. During scan dump and memory dump operations, a bypass path around the scan elements of the secure register may be invoked. This may effectively exclude the scan elements of the subset from being included in the scan chain. Data is not shifted through the scan elements of the subset during scan shifting that occurs in conjunction with operations in the scan dump mode and the memory dump mode. This may prevent access to the contents of the secure register, which may be intended to be kept secure from access.

In one embodiment, a method may include operating an integrated circuit in a first mode. The first mode may be a normal scan test mode, wherein test stimulus data is shifted through the scan chain to designated elements, applied to circuitry, with resulting data captured in various ones of the scan elements, and subsequently shifted out. In the first mode, scan shifting may be performed through any of the scan elements of the scan chain, including those that are implemented as part of a secure register. The method further includes operating in a second mode. The second mode, a scan dump or a memory dump may be performed. When operating in the second mode, a bypass path may be invoked around the subset of scan elements that make up the secure register. Accordingly, during any scan shifting operation that occur in the second mode, the scan elements of the secure register may be effectively excluded from the scan chain, with no data shifted through these elements or accessible therefrom. This may in turn allow for the protection of data stored in the secure register (e.g., an encryption key) that may be intended to remain inaccessible.

BRIEF DESCRIPTION OF THE DRAWINGS

The following detailed description makes reference to the accompanying drawings, which are now briefly described.

Figure 1:
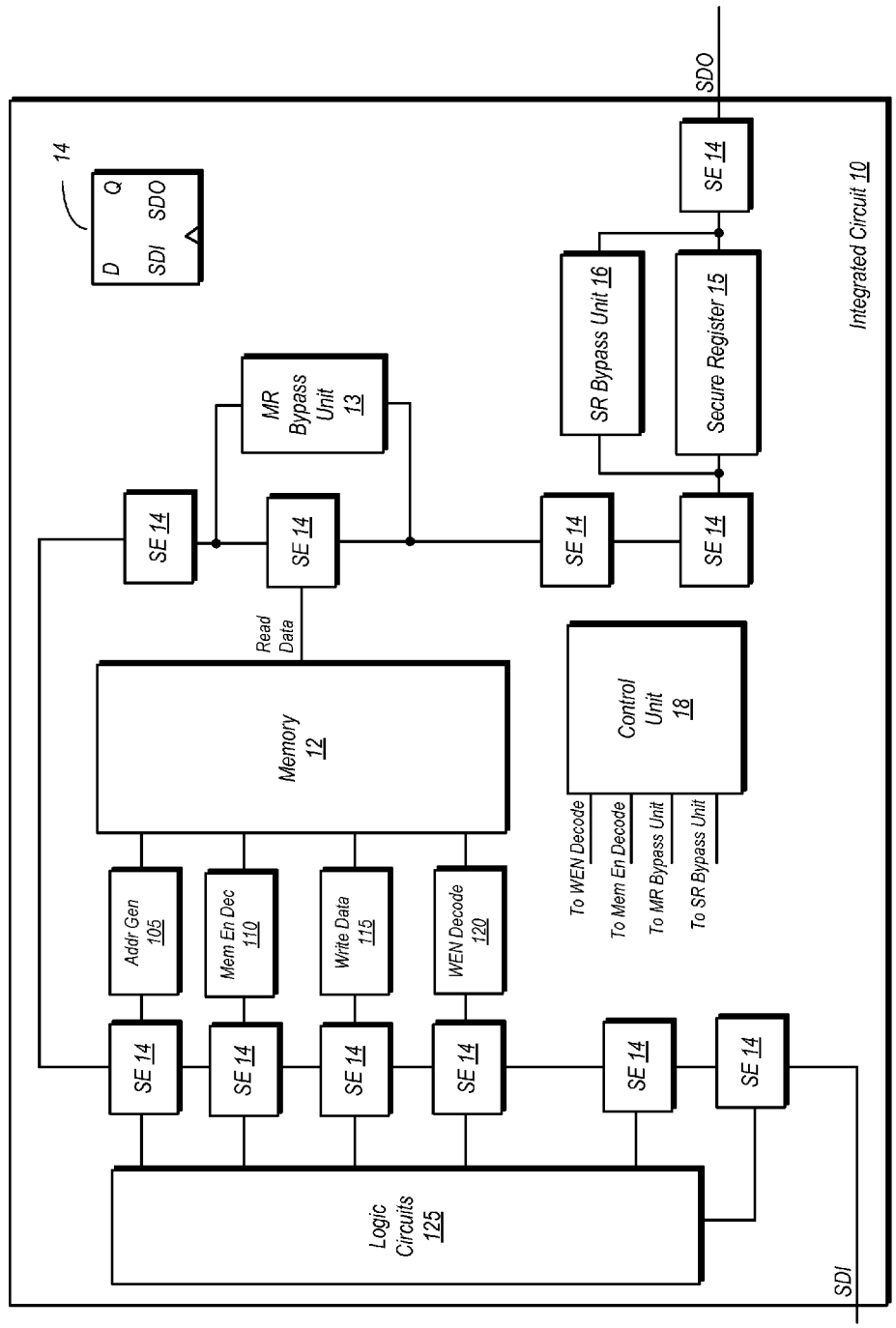
FIG. 1 is a block diagram of one embodiment of an integrated circuit (IC) including a scan chain and a secure register.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Integrated Circuit with Scan Chain and Secure Register

Turning now to FIG. 1, a block diagram of one embodiment of an integrated circuit having a scan chain and a memory. In the embodiment shown, integrated circuit (IC) 10 includes a scan chain having a number of serially coupled scan elements 14. The scan elements may be any one of a number of different scan element designs, including level sensitive scan design (LSSD) elements and multiplexer-D ('Mux-D') scan elements. Exemplary ones of the scan elements 14 are shown here as coupled to logic circuits 125 (in practice, most or all of the scan elements of a scan chain are coupled to other, non-scan related circuitry). The scan elements 14 may provide data to and/or receive data from logic circuits 125, which may be combinational circuits, sequential circuits, or a mixture of both. In some cases, mixed signal circuitry may also be included.

An exemplary embodiment of a scan element 14 is shown in the upper right corner of the drawing. In the embodiment shown, scan element 14 includes a data input ('D') and a data output ('Q'), both of which may be coupled to other, non-scan related circuitry (e.g., logic circuits 125). Each scan element 14 also includes a scan data input ('SDI') and a scan data output ('SDO'). A serial scan chain may be formed by coupling the scan data output of one scan element 14 to a scan data input of a next scan element 14, and repeating this in a manner to form the scan chain. A first scan element 14 of the scan chain may have a scan data input coupled to a chip-level scan data input ('SDI' input on IC 10). A last scan element 14 of the scan chain may have a scan data output coupled to a chip-level scan data output ('SDO' output of IC 10). The number of scan elements in a particular scan chain may be any number desired and suitable for the particular implementation of IC 10. Furthermore, embodiments having multiple scan chains (some of which may be coupled together in various ways) are also possible and contemplated.

Scan shifting may be performed to input data into IC 10 or to extract data therefrom. For example, in a normal scan test mode, test stimulus data may be serially shifted into IC 10 through the chip-level scan data input, from one scan element 14 to the next (via respective element-level scan data inputs and scan data outputs) until all test stimulus data has been received at its intended scan element 14. The test stimulus data may then be applied to circuitry coupled to the data output ('Q') of each scan element 14, or from selected instances thereof. Test result data may be captured by respective data inputs ('D') of each scan element 14 or by selected instances thereof. Captured test result data may then be shifted through scan chain in the manner previously described, exiting IC 10 through the chip-level scan data output.

A chain of scan elements 14 may also be used for other purposes than normal scan testing. For example, chains of scan elements 14 (or other embodiments of a scan element) may be useful in extracting data when debugging software intended to execute on IC 10. One way that data may be extracted is through a scan dump. During a scan dump, data may be captured by each scan element 14 (or by selected instances) via their respective data inputs. The captured data may be indicative of a current state of logic circuitry having outputs coupled to the respective data inputs of scan elements 14. Afterwards, the captured data may be shifted from IC 10 in the manner described above and received externally for analysis.

IC 10 in the embodiment shown includes a memory 12, which may be used to store data during operation. Memory 12 in this embodiment includes four groups of input signals: address signals, data signal, a memory enable signal, and a write enable signal. The address signals may be received from address generator 105, while the data signals may be received from write data logic 115. It is noted that although only a single signal line is shown for each of the address and data paths into the memory, multiple signal lines may be present for each, and thus the single signal line is shown here for the sake of simplicity. Furthermore, multiple instances of scan elements 14 may be coupled to each of address generation logic 105 and write data logic 115, although only single instances of each are shown here for the sake of simplicity.

The memory enable decode logic 110 may provide decoding to determine when a memory enable signal is to be asserted. In the embodiment shown, the memory enable signal may be asserted when memory 12 is to be made accessible. The write enable decode logic ('WEN decode') 120 may provide decoding to determine when a write enable signal is to be asserted to enable writes. Reads from memory 12 in this embodiment may be enabled when the memory enable signal is asserted. Writes to memory 12 in this embodiment may be enabled when memory enable and write enable signals are both asserted.

Memory 12 in the embodiment shown also includes an output data path. The output data path may be a path from which data read from memory 12 is conveyed. In this example, a single instance of a signal line from the output data path is shown for the sake of simplicity, although it is to be understood that multiple signal lines may be present to support reads from memory 12 at the desired width. In the embodiment shown, the exemplary signal line of the output data path is coupled to a scan element 14, and other instances of signal lines of the path may be similarly coupled to instances of scan elements. Each of these scan elements 14 may be further coupled to additional circuitry of IC 10.

In addition to the ability to perform a scan dump as described above, the scan chain may also provide the ability to extract data from memory 12 by performing a memory dump. To perform a memory dump, an address may be shifted into IC 10 through the scan chain and applied to memory 12 via scan elements 14 associated with the address inputs. Data may be read from the applied address and captured by those scan elements 14 coupled to the output data path. The data may then be shifted through the scan chain. In some cases, the amount of shifting of the data may correspond to the width of the data received or the width of the address. Another address may be applied and the process repeated. This may be repeated for a number of readable memory addresses in order to capture the contents of the memory at a given time.

Control unit 18 in the embodiment shown may provide certain control functions during the shifting of data through the scan chain during the various modes of operation. If the contents of memory 12 are to remain undisturbed during scan shifting, control unit 18 may provide a signal to write enable decoder 120 to hold a write enable signal de-asserted. Similarly, if both writes to and reads from memory 12 are to be prevented, control unit 18 may prevent the write enable signal and a memory enable signal from being asserted.

In addition to the above, control unit 18 may assert signals that may prevent the reading of certain addresses of memory 12. During operation (including debugging operations), memory 12 may store secure data in certain addresses of memory 12. The secure data may be such that it is secret and/or otherwise not intended for external address (e.g., a cryptography key). Accordingly, control unit 18 may assert and provide a control signal to memory read bypass unit 12 in order to invoke a bypass path. When the bypass path is invoked, a bypass path may be formed that passes around those scan elements 14 that are coupled to the output data path of memory 12. Control unit 18 may invoke the bypass path responsive to the inputting of an address that is associated with secure data or data otherwise not intended for access.

Although not explicitly shown here, control unit 18 may be coupled to address generator 105 in such a manner that it may monitor address information to be provided to memory 12 during various operations (e.g., scan dump, memory dump) in order to prevent the reading of data in protected addresses. In some cases, control unit 18 may also inhibit reads from memory responsive to detecting a protected address by causing the memory enable signal to be de-asserted.

IC 10 in the embodiment shown also includes a secure register 15. Although not explicitly shown in FIG. 1, secure register 15 may include a number of serially coupled scan elements 14 through which data may be shifted during scan shifting operations in a normal scan test mode. A secure register bypass unit 16 is also coupled to divert the scan path during scan shifting in other modes (e.g., memory dump, scan dump) in order to prevent contents intended to remain secret from being accessed. The bypass path provided by secure register bypass unit 16 may be invoked responsive to receiving a control signal from control unit 18. The control signal invoking the bypass path may be asserted whenever IC 10 is operating in a dump mode, such as the scan dump mode described above. Additional details of secure register 15 and the invoking of a bypass path will now be discussed in further detail with reference to FIG. 2.

Figure 2:
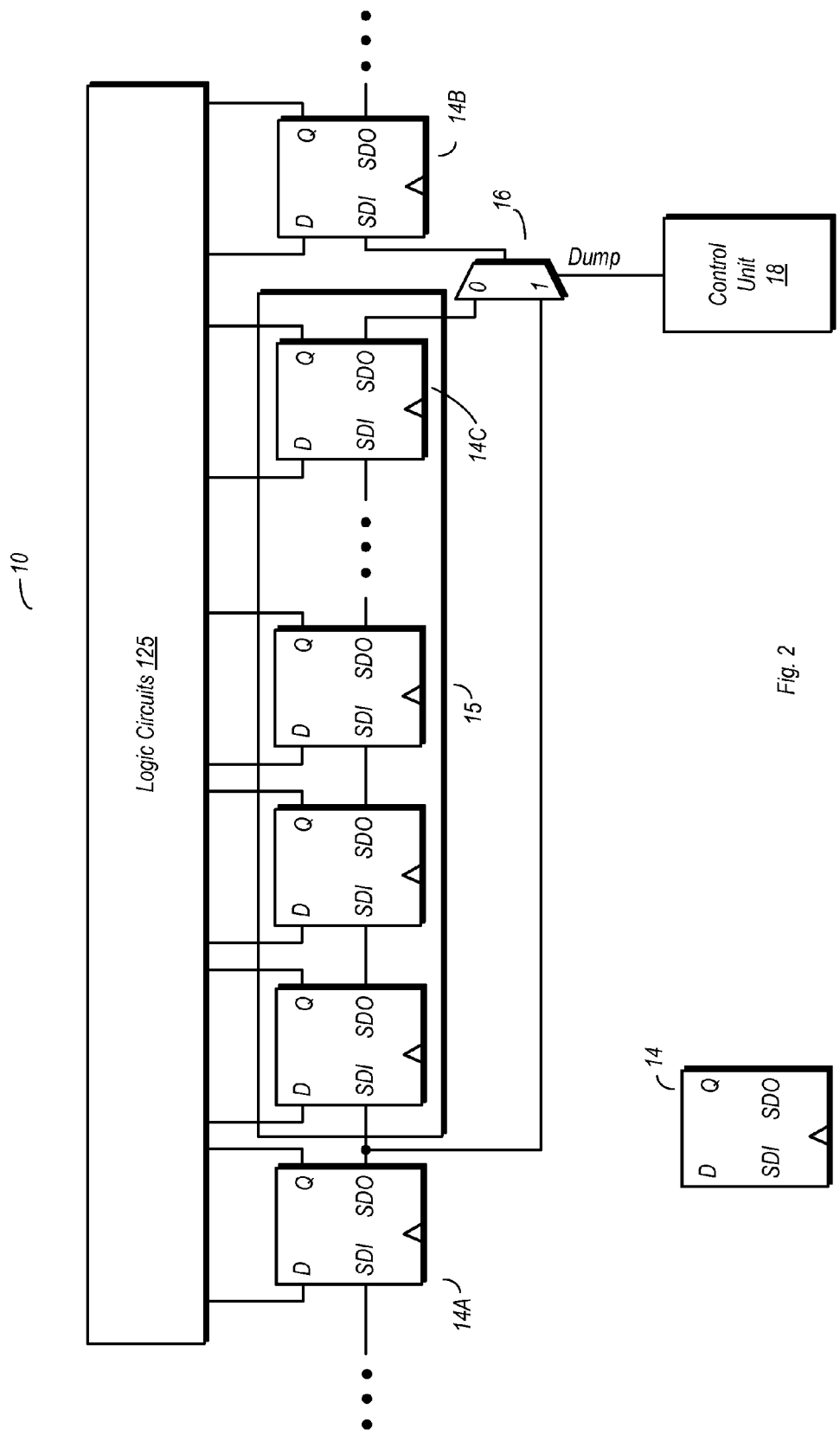
FIG. 2 is a block diagram illustrating one embodiment of a bypass circuit configured to invoke a bypass path around scan elements of a secure register.

Scannable Secure Register with Bypass Circuitry:

FIG. 2 is a block diagram further illustrating one embodiment of secure register 15 and its place within a scan chain. In the embodiment shown, secure register 15 includes a number of serially coupled scan elements 14. Accordingly, secure register 15 may function as a shift register. Furthermore, each scan element 14 of secure register 15 includes a data input 'D' and a data output 'Q' coupled to logic circuits 125. Accordingly, data may be provided to or received from secure register 15 in parallel as well.

The scan elements 14 of secure register 15 in the embodiment shown are part of a larger scan chain (e.g., the scan chain shown in FIG. 1, or an even larger scan chain). Thus, secure register 15 may be considered to include a subset of scan elements 14 of the scan chain, while another subset of scan elements 14 may include those that are not included in secure register 15.

Scan register bypass unit 16 in the embodiment shown is implemented as a multiplexer. A first input ('0') of the multiplexer is coupled to a scan data output of a last serially coupled scan element 14 of secure register 15. A second input ('1') of the multiplexer is coupled to a scan data output of scan element 14A. The output of the multiplexer is coupled to a scan data input of scan element 14B. Accordingly, data being shifted through the scan chain may take one of two paths depending on the selection of the multiplexer that implements secure register bypass unit 16. In the embodiment shown, control unit 18 is coupled to provide a selection signal ('Dump') to secure register bypass unit 16. When the selection signal is not asserted, the '0' input is selected and the scan path may include the scan elements 14 of secure register 15. When the selection signal is asserted, the '1' input is selected and the scan path may exclude the scan elements 14 of secure register 15. Moreover, activating the bypass path by selecting the '1' input may effectively couple the scan data output of scan element 14A to the scan data input of scan element 14B.

During normal scan testing operations, control unit 18 may hold as de-asserted the selection signal to secure register bypass unit 18. Accordingly, test stimulus data may be shifted into the scan elements 14 of secure register 15, and applied (via their respective 'Q' outputs) to logic circuits 125. During a capture phase of a normal scan test, test result data may be captured on respective 'D' inputs of those scan elements 14 implemented as part of secure register 15. The captured test result data may also be shifted through the scan chain, including through the scan elements 14 of secure register. Captured test result data may exit secure register 15 through the scan data output of scan element 14C, and may be provided to the scan data input of scan element 14B, through secure register bypass unit 14. Since the applied test stimulus data and the captured test result data is not considered protected data or data that is otherwise not intended for unauthorized access, allowing the scan elements 14 of secure register 15 to be included in a normal scan test may not compromise security.

During operation of IC 10 (other than normal scan test mode), certain data that is not intended for general access may be stored therein. For example, software executing on IC 10 may cause a cryptography key to be stored in secure register 15. If the development stage of the software is in debugging or otherwise pre-release phase, it may be desirable at certain times to perform a dump operation to determine a state of internal circuitry of IC 10. Dump operations may include performing a scan dump, in which the respective states of circuits coupled to 'D' inputs of scan elements 14 may be captured and shifted from IC 10 through the chip level scan data output, to be received for further analysis. Another type of dump operation is a memory dump, in which all non-protected addresses of a memory of IC 10 may be captured and shifted from IC 10. In either of these cases, control unit 18 may assert the selection signal 'dump' to activate the bypass path in order to prevent access to the contents stored in the scan elements 14 of secure register 15.

When the bypass path is activated, the scan elements 14 (including scan element 14C) of secure register 15 are effectively excluded from the larger scan chain of scan elements of which they are otherwise included. Data may be shifted through any active scan element 14 of the remaining subset that is not included in secure register 15. When the bypass path is activated, data shifted through the portion of the scan chain shown here may exit the scan data output of scan element 14A and be received by the scan data input of scan element 14B, vias scan register bypass unit 16. Accordingly, whatever data is stored in the scan elements 14 of secure register 15 remains inaccessible during scan shifting operations occurring in either of the scan dump and memory dump modes. It is also noted that the bypass path may be activated at other times as well. For example, during a normal operational mode of IC 10 within an end product, control unit 18 may hold the state of the selection signal so that the bypass path remains active to prevent the possibility of external access to the contents of secure register 15.

Figure 3:
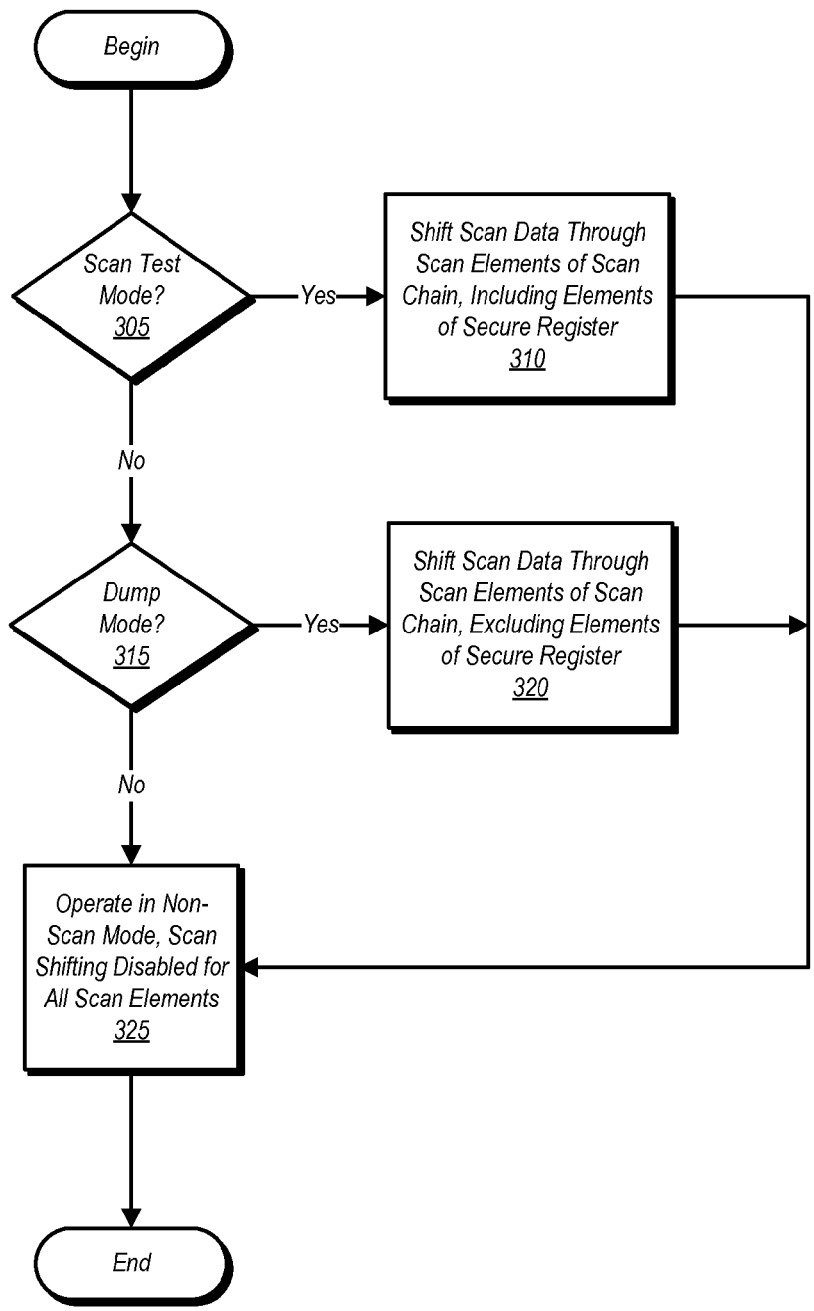
FIG. 3 is a flow diagram of one embodiment of a method for operating an IC in various scan modes.

Method Flow Diagrams:

FIG. 3 is a flow diagram of one embodiment of a method for operating an IC in various scan modes. More particularly, FIG. 3 illustrates a mode-dependent difference in scan paths through which data is shifted in a scan chain.

If the IC is operating in a normal scan test mode (block 305, yes), data may be shifted in the scan chain through all enabled elements of the scan chain (block 310). The enabled scan elements may include those of a secure register. Test stimulus data may be shifted into the scan elements of the secure register to perform a test. Test result data (generated responsive to applying test stimulus data) may be captured by the scan elements of the secure register. For all shift operations, data may pass through the scan elements of the secure register.

If not operating in the normal scan test mode (block 305, no), but operating in the dump mode (block 315, yes), then the scan elements of the secure register may be bypassed (block 320). The dump mode may be a scan dump mode or a memory dump mode, as described above. Activating a bypass path may effectively exclude the scan elements of the scan register from the scan path. Data may be shifted through other scan elements other than those of the secure register. However, the data stored in the secure register may be protected by excluding its respective scan elements from the scan chain.

If operating in neither the normal scan test mode (block 305, no) or one of the dump modes (block 315, no), then scan shifting may be disabled for all scan elements (block 325). It is noted that in some embodiments, other scan modes may be implemented. However, in a normal operational mode, scan shifting may be disabled.

Figure 4:
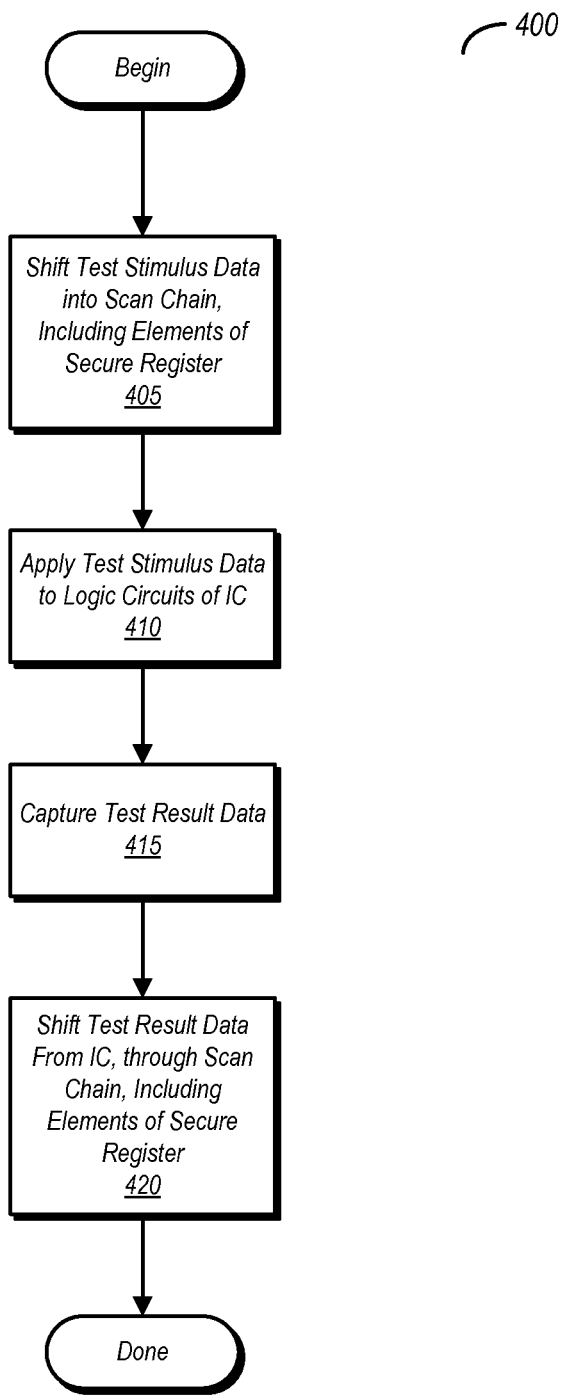
FIG. 4 is a flow diagram of one embodiment of a method for performing a normal scan test.

FIG. 4 is a flow diagram of one embodiment of a method for performing a normal scan test. Method 400 begins with the inputting of test stimulus data by shifting it into a scan chain (block 405). The scan elements through and to which data may be shifted in the normal scan mode includes those scan elements that are part of the secure register, since the test stimulus data is not considered to be secure data.

Each bit of test stimulus may be shifted to its intended target scan element. The test stimulus data may then be applied, from respective data of each scan element, to the logic circuits of the IC (block 410). After allowing time for the logic circuits to respond to the test stimulus data, result data may be captured on respective data inputs of each scan element (block 415). Scan elements of the secure register may be included in the group of scan elements that capture test result data. Subsequent to its capture, the test result data may then be extracted from the IC by shifting it through the scan chain (block 420). The shifting operation may include shifting test result data through the scan elements of the secure register, since there is no danger of protected data being compromised in this case.

Figure 5:
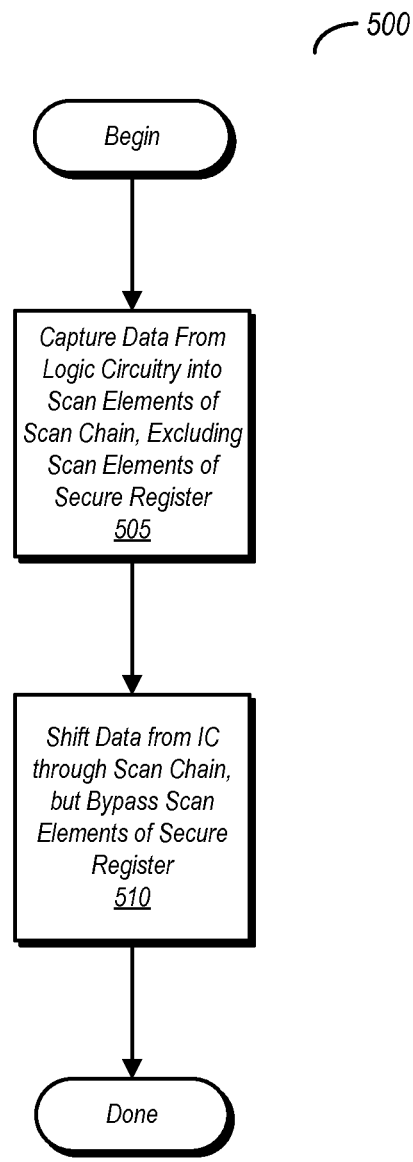
FIG. 5 is a flow diagram of one embodiment of a method for operating in a dump mode.

FIG. 5 illustrates a contrast between scan operations in a normal scan test mode, and scan operations associated with a dump mode (a scan dump in this example). Method 500 begins with the capture of data from logic circuitry in an IC by correspondingly coupled scan elements (block 505). However, the group of scan elements into which data is captured excludes the scan elements in the secure register in this case in order to prevent the potential compromise of protected data. The captured data may be indicative of a state of the IC generated during the operation including the execution of software intended to operate thereon. Accordingly, the execution of such software may include the storing of protected data in the secure register. Since the secure data can affect the state of the circuits to which it is coupled, the capture of data therefrom could potentially compromise its contents. Since the data captured in a dump mode may included data generated as a result of interaction with the secure register, this data is excluded from the scan dump by excluding the scan elements of the secure register from the scan chain through the use of bypass circuitry.

Subsequent to its capture by the active scan elements (e.g., those not excluded from the scan chain by bypass circuitry), the state data may be shifted from the IC through a chip-level scan data output (block 510). The scan elements of the secure register remain bypassed for scan shifting operations in a dump mode. Accordingly, data is shifted through the scan chain without passing through these particular scan elements. Moreover, any data that was present in the scan elements of the secure register is not shifted from the IC, thereby preventing unauthorized access to secure data.

Figure 6:
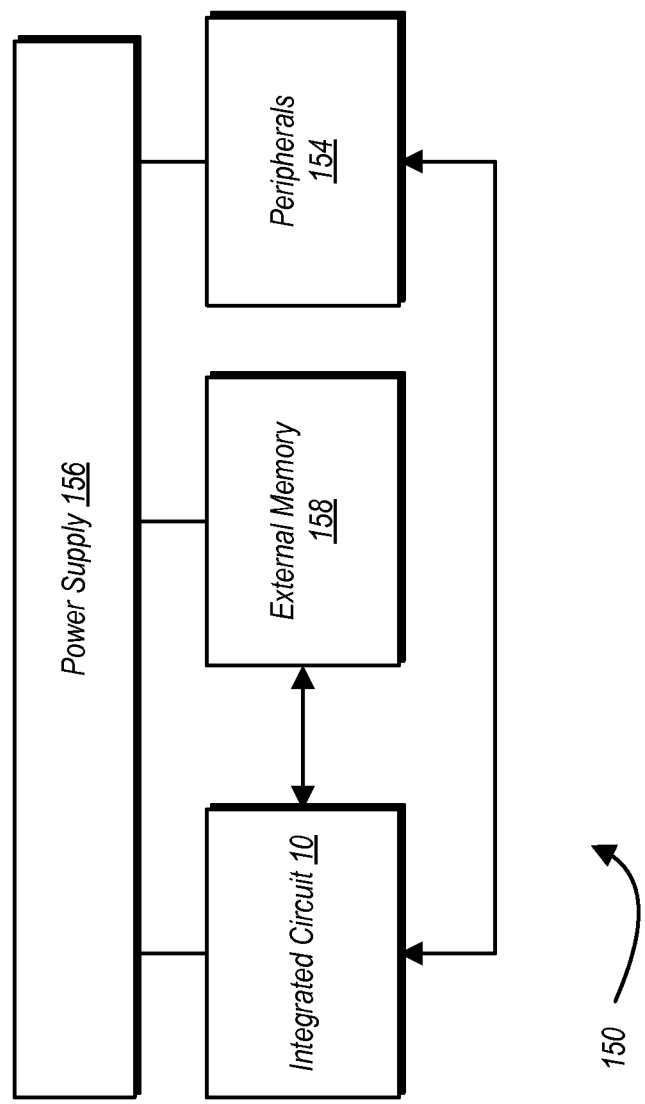
FIG. 6 is a block diagram of one embodiment of a system.

Exemplary System:

Turning next to FIG. 6, a block diagram of one embodiment of a system 150 is shown. In the illustrated embodiment, the system 150 includes at least one instance of an IC 10 (e.g., from FIG. 1) coupled to one or more peripherals 154 and an external memory 158. A power supply 156 is also provided which supplies the supply voltages to the IC 10 as well as one or more supply voltages to the memory 158 and/or the peripherals 154. In some embodiments, more than one instance of the IC 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as wifi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, net top etc.).

The external memory 158 may include any type of memory. For example, the external memory 158 may be SRAM, dynamic RAM (DRAM) such as synchronous DRAM (SDRAM), double data rate (DDR, DDR2, DDR3, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An integrated circuit comprising:
   a scan chain having a plurality of serially coupled scan elements;
   a secure register, wherein the secure register includes a subset of the plurality of serially coupled scan elements; and
   a bypass circuit configured to, when active, select a bypass path that causes the subset of the plurality of serially coupled scan elements to be bypassed during scan shifting operations, wherein the bypass circuit is configured to disable the bypass path during operation in a scan test mode, and wherein the bypass circuit is further configured to enable the bypass path during operation in either of a scan dump mode and a memory dump mode;
   wherein the bypass circuit is further configured to cause contents stored in the secure register to be inaccessible external to the integrated circuit when operating in a mode other than the scan test mode.

2. The integrated circuit as recited in claim 1, wherein each of the subset of scan elements is configured to receive scan data and further configured to convey scan data when performing scan shifting in a scan test mode.

3. The integrated circuit as recited in claim 1, wherein the bypass circuit includes a selection circuit having a first input coupled to an output of one scan element of the subset of the plurality of serially-coupled scan elements and a second input coupled to an output of one of the plurality of scan elements not included in the subset, and a select input coupled to a logic circuit.

4. The integrated circuit as recited in claim 3, wherein the bypass circuit includes a control unit configured to assert a selection signal to the selection circuit responsive to commencement of operation, by the integrated circuit, in a scan dump mode or memory dump mode.

5. The integrated circuit as recited in claim 4, wherein the control unit is coupled to provide the bypass signal on the select input of the selection circuit, and wherein the selection circuit is configured to activate the bypass path responsive to the assertion of the bypass signal.

6. A method comprising:
operating an integrated circuit in a first mode, wherein operating in the first mode includes shifting data through each of a plurality of serially-coupled scan elements of a scan chain, and wherein the plurality of scan elements includes a first subset of scan elements and a second subset of scan elements, wherein a secure register of the integrated circuit includes the second subset of scan elements;
operating the integrated circuit in a second mode, wherein operating in the second mode includes shifting data through each of the first subset of scan elements and inhibiting data from being shifted through the second subset of scan elements; and
inhibiting access, from external to the integrated circuit, to contents stored in the secure register when operating in a mode other than the first mode.

7. The method as recited in claim 6, wherein the first mode is a scan testing mode and wherein the second mode is one of a scan dump mode and a memory dump mode.

8. The method as recited in claim 6, further comprising selecting a first input of a selection circuit when operating in the first mode and selecting a second input when operating in the second mode, wherein the first input is coupled to an output of one scan element of the second subset of scan elements, and wherein the second input is coupled to an output of the first subset of scan elements.

9. The method as recited in claim 8, further comprising a control unit asserting a selection signal to a first state when operating in the first mode and to a second state when operating in the second mode, wherein the selection circuit is configured to select the first input responsive to the selection signal being in the first state and further configured to select the second input responsive to the selection signal being in the second state.

10. The method as recited in claim 6, further comprising entering the second mode without performing a reset of the IC.

11. An apparatus comprising:
a plurality of serially coupled scan elements including a first subset of scan elements and a second subset of scan elements, wherein the second subset of scan elements comprise a secure register; and
a bypass unit, wherein the bypass unit is configured to select a first scan path when shifting data in a scan test mode, wherein the first path comprises each scan element of the first subset of scan elements and each scan element of the second subset of scan elements;
wherein the bypass unit is further configured to select a second scan path when shifting data in one of a scan dump mode and a memory dump mode, wherein the second scan path includes each of the scan elements of the first subset and excludes each of the scan elements of the second subset, and wherein the bypass unit is further configured to inhibit contents stored in the secure register from being accessed from external to the integrated circuit when the integrated circuit is not operating in the scan test mode.

12. The apparatus as recited in claim 11, wherein the apparatus includes a secure register, wherein the secure register comprises each of the scan elements of the second subset.

13. The apparatus as recited in claim 11, wherein an input of a first scan element of the second subset of scan elements is coupled to an output of a first scan element of the first subset of scan elements, and wherein an output of a second scan element of the second subset of scan elements is coupled to an input of a second scan element of the first subset of scan elements.

14. The apparatus as recited in claim 11, wherein the bypass unit includes a control unit, wherein the control unit is configured to provide an indication when the integrated circuit is operating in one of the scan dump mode and the memory dump mode, and wherein the control unit is further configured to de-assert the indication when operating in the scan bypass mode.

15. The apparatus as recited in claim 11, wherein the bypass unit includes a multiplexer, wherein the multiplexer includes a first input coupled to an output of one scan element of the first subset of scan elements, and a second input coupled to one scan element of the second subset of scan elements.

16. A method comprising:
shifting scan data through a first path, wherein the first path comprises a plurality of serially coupled scan elements, wherein a first subset of scan elements of the plurality of serially coupled scan elements comprises storage elements of a secure register, and wherein said shifting scan data through the first path is performed when operating in a scan testing mode;
shifting scan data through a second path, wherein the second path excludes each of the first subset of scan elements and includes remaining ones of the plurality of serially coupled scan elements, wherein said shifting scan data through the second path is performed when operating in a dump mode; and
inhibiting access, from external to the integrated circuit, to contents stored in the secure register when operating in a mode other than the scan testing mode.

17. The method as recited in claim 16, wherein the dump mode is a scan dump mode, wherein operating in the dump mode comprises:
selected ones of the plurality of serially coupled scan elements, excluding the scan elements of the first subset, capturing data from logic circuits that are coupled to respective ones of the plurality of serially coupled scan elements;
shifting data captured from the logic circuits through the second path to an output of an integrated circuit in which the scan chain is implemented.

18. The method as recited in claim 16, wherein the dump mode is a memory dump mode, wherein operating in the memory dump mode comprises:
a second subset of scan elements coupled to a memory output path capturing data from a selected memory address;
shifting data through the first path by at least a number of scan elements included in the second subset; and
repeating said capturing data and said shifting data for each additional address of the memory for which data is to be captured.

19. The method as recited in claim 16, further comprising a bypass unit selecting the first path when operating in the scan testing mode and selecting the second path when operating in the dump mode.

20. The method as recited in claim 19, further comprising:
configuring a multiplexer to select a first input when selecting the first path; and
configuring the multiplexer to select a second input when selecting the second path;
wherein the first input is coupled to an output of one of the plurality of serially coupled scan elements excluded from the first subset; and
wherein the second input is coupled to an output of one of the scan elements of the first subset.

21. An integrated circuit comprising:
a secure register comprising a first plurality of storage elements;
a scan chain comprising the first plurality of storage elements and the second plurality of storage elements, wherein the first and second plurality of storage elements are coupled together in a serial configuration;
a bypass unit configured to, when operating in a scan testing mode, select a first scan path comprising the first plurality of storage elements and the second plurality of storage elements, and further configured to, when operating in a dump mode, select a second scan path comprising the second plurality of scan elements and excluding the first plurality of scan elements, and wherein the bypass circuit is further configured to inhibit contents stored in the secure register from being accessed from external to the integrated circuit when the integrated circuit is not operating in the scan testing mode.

22. The integrated circuit as recited in claim 21, wherein the dump mode is a scan dump mode, and wherein each of the second plurality of scan elements is configured to capture data from logic circuits coupled to respective ones of the second plurality of scan elements when operating in the scan dump mode, and wherein a control unit is configured to cause data captured from the logic circuits to be shifted from the integrated circuit through the second path when operating in the scan dump mode.

23. The integrated circuit as recited in claim 21, wherein the dump mode is a memory dump mode, wherein a subset of the second plurality of scan elements is configured to capture data output from a memory in the memory dump mode, and wherein a control unit is configured to cause the captured data to be shifted from the integrated circuit through the second path when operating in the scan dump mode.

24. The integrated circuit as recited in claim 21, wherein the integrated circuit includes a control unit, wherein the control unit is configured to, when operating in the scan testing mode, cause test stimulus data to be shifted into the integrated circuit through the first path and test result data to be shifted from the integrated circuit through the first path.

25. The integrated circuit as recited in claim 21, wherein the integrated circuit includes a control unit, and wherein the control unit is configured to cause the integrated circuit to enter the dump mode without performing a reset.

* * * * *